US009095869B2

(12) United States Patent
Kilpi et al.

(10) Patent No.: US 9,095,869 B2
(45) Date of Patent: Aug. 4, 2015

(54) ATOMIC LAYER DEPOSITION WITH PLASMA SOURCE

(75) Inventors: Vaino Kilpi, Espoo (FI); Wei-Min Li, Espoo (FI); Timo Malinen, Espoo (FI); Juhana Kostamo, Espoo (FI); Sven Lindfors, Espoo (FI)

(73) Assignee: Picosun OY, Espoo (FI)

( * ) Notice: Subject to any disclaimer, the term of this patent is extended or adjusted under 35 U.S.C. 154(b) by 38 days.

(21) Appl. No.: 14/009,647

(22) PCT Filed: Apr. 7, 2011

(86) PCT No.: PCT/FI2011/050303
§ 371 (c)(1),
(2), (4) Date: Oct. 3, 2013

(87) PCT Pub. No.: WO2012/136876
PCT Pub. Date: Oct. 11, 2012

(65) Prior Publication Data
US 2014/0024223 A1    Jan. 23, 2014

(51) Int. Cl.
| H01L 21/31 | (2006.01) |
| B05C 5/00 | (2006.01) |
| C23C 16/40 | (2006.01) |
| C23C 16/455 | (2006.01) |
| H01L 21/02 | (2006.01) |
| H01J 37/32 | (2006.01) |

(52) U.S. Cl.
CPC ............ *B05C 5/001* (2013.01); *C23C 16/403* (2013.01); *C23C 16/45542* (2013.01); *C23C 16/45544* (2013.01); *C23C 16/45582* (2013.01); *H01J 37/32357* (2013.01); *H01J 37/32449* (2013.01); *H01J 37/32743* (2013.01); *H01J 37/32871* (2013.01); *H01L 21/02274* (2013.01)

(58) Field of Classification Search
None
See application file for complete search history.

(56) References Cited

U.S. PATENT DOCUMENTS

| 2005/0019494 A1 | 1/2005 | Moghadam et al. ...... 427/255.32 |
| 2005/0271812 A1 | 12/2005 | Myo et al. ................. 427/248.1 |
| 2007/0116872 A1 | 5/2007 | Li et al. ..................... 427/248.1 |
| 2008/0081104 A1 | 4/2008 | Hasebe et al. ................ 427/58 |
| 2008/0264337 A1 | 10/2008 | Sano et al. ................... 118/704 |
| 2009/0250004 A1 | 10/2009 | Yamada et al. .............. 118/722 |
| 2009/0315093 A1* | 12/2009 | Li et al. ......................... 257/314 |
| 2010/0183825 A1 | 7/2010 | Becker et al. ................. 427/569 |

FOREIGN PATENT DOCUMENTS

| JP | 2007-162131 | 6/2007 |
| JP | 2008-109091 | 5/2008 |
| JP | 2008-277762 | 11/2008 |
| WO | WO-2007/066472 A1 | 6/2007 |

OTHER PUBLICATIONS

Puurunen, R.L., "Surface chemistry of atomic layer deposition: A case study for the trimethylaluminum/water process" © 2005 American Institute of Physics, 52 pgs.

* cited by examiner

*Primary Examiner* — Yasser A Abdelaziez
(74) *Attorney, Agent, or Firm* — Harrington & Smith

(57) ABSTRACT

The invention relates to method including operating a plasma atomic layer deposition reactor configured to deposit material in a reaction chamber on at least one substrate by sequential self-saturating surface reactions, and allowing gas from an inactive gas source to flow into a widening radical in-feed part opening towards the reaction chamber substantially during a whole deposition cycle. The invention also relates to a corresponding apparatus.

18 Claims, 8 Drawing Sheets

ATOMIC LAYER DEPOSITION WITH PLASMA SOURCE

FIELD OF THE INVENTION

The present invention generally relates to deposition reactors with a plasma source. More particularly, but not exclusively, the invention relates to such deposition reactors in which material is deposited on surfaces by sequential self-saturating surface reactions.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to a substrate. The substrate is located within a reaction space. The reaction space is typically heated. The basic growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase. Bonding by physisorption is much weaker because only van der Waals forces are involved. Physisorption bonds are easily broken by thermal energy when the local temperature is above the condensation temperature of the molecules.

The reaction space of an ALD reactor comprises all the heated surfaces that can be exposed alternately and sequentially to each of the ALD precursor used for the deposition of thin films. A basic ALD deposition cycle consists of four sequential steps: pulse A, purge A, pulse B and purge B. Pulse A typically consists of metal precursor vapor and pulse B of non-metal precursor vapor, especially nitrogen or oxygen precursor vapor. Inactive gas, such as nitrogen or argon, and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film of desired thickness.

Precursor species form through chemisorption a chemical bond to reactive sites of the heated surfaces. Conditions are typically arranged in such a way that no more than a molecular monolayer of a solid material forms on the surfaces during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is typically followed by a first purge step (purge A) wherein the excess first precursor and possible reaction by-products are removed from the reaction space. Second precursor vapor is then introduced into the reaction space. Second precursor molecules typically react with the adsorbed species of the first precursor molecules, thereby forming the desired thin film material. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film has grown to a desired thickness. Deposition cycles can also be more complex. For example, the cycles can include three or more reactant vapor pulses separated by purging steps. All these deposition cycles form a timed deposition sequence that is controlled by a logic unit or a microprocessor.

Thin films grown by ALD are dense, pinhole free and have uniform thickness. For example, aluminum oxide grown by thermal ALD from trimethylaluminum $(CH_3)_3Al$, also referred to as TMA, and water at 250-300° C. has usually about 1% non-uniformity over the 100-200 mm diameter wafer. Metal oxide thin films grown by ALD are suitable for gate dielectrics, electroluminescent display insulators, fill layers for magnetic read head gaps, capacitor dielectrics and passivation layers. Metal nitride thin films grown by ALD are suitable for diffusion barriers, e.g., in dual damascene structures.

Precursors suitable for ALD processes in various ALD reactors are disclosed, for example, in review article R. Puurunen, "Surface chemistry of atomic layer deposition: A case study for the trimethylaluminium/water process", J. Appl. Phys., 97 (2005), p. 121301, which is incorporated herein by reference.

The use of radicals in ALD processes may achieve some advantages, such as the possibility to use thermally sensitive substrates at very low deposition temperatures. In a plasma ALD reactor, radicals are generated by a plasma source. The use of a plasma source, however, may cause certain requirements or specific problems for the deposition reactor.

SUMMARY

According to a first example aspect of the invention there is provided a method comprising:
operating a plasma atomic layer deposition reactor configured to deposit material in a reaction chamber on at least one substrate by sequential self-saturating surface reactions; and
allowing gas from an inactive gas source to flow into a widening radical in-feed part opening towards the reaction chamber substantially during a whole deposition cycle.

The expression "allowing . . . to flow" may in practice mean "guiding", "conducting" or "guiding to flow".

In certain embodiments, the deposition reactor is a plasma enhanced atomic layer deposition reactor, a PEALD reactor. In certain embodiments, the deposition reactor comprises a plasma source on the top side of the reactor chamber. In certain embodiments, the plasma source is an inductively coupled plasma source. In certain embodiments, the plasma source produces radicals used as reactants in the deposition reactor. In certain embodiments, the activated species output of the plasma source consists of radicals. In these embodiments, the activated species output is radicals without substantially containing ions.

In certain embodiments, the plasma atomic layer deposition reactor (plasma ALD reactor) may be used for both plasma ALD and thermal ALD. The in-feed lines for thermal ALD may be separate from the plasma ALD source line via which radicals are guided into the reaction chamber.

A deposition process consists of one or more consecutive deposition cycles. Each deposition cycle may consist of a thermal ALD period followed by a plasma ALD period or a plasma ALD period followed by a thermal ALD period. Each plasma ALD period may substantially consist of a plasma ALD pulse period (radical generation period) and a subsequent plasma ALD purge period. Similarly, each thermal ALD period may substantially consist of a thermal ALD pulse period and a subsequent thermal ALD purge period. In certain embodiment, each ALD cycle may comprise more than two pulse periods (which may be followed by respective purge periods).

In certain embodiments, the method comprises: allowing gas from the inactive gas source to flow into the radical in-feed part via a plasma source during a plasma precursor pulse period of a plasma atomic layer deposition period, the gas during that pulse period functioning as carrier gas for generated radicals.

In certain embodiments, the method comprises: allowing gas from the inactive gas source to flow into the radical in-feed part via the plasma source during a purge period of a plasma atomic layer deposition period, the gas during that purge period functioning as purge and inert shield gas.

In certain embodiments, the method comprises: allowing gas from the inactive gas source to flow into the radical in-feed part via the plasma source both during a plasma atomic layer deposition period and during a thermal atomic layer deposition period.

In certain embodiments, the method comprises: allowing gas from an inactive gas source to flow into the radical in-feed part via a route that bypasses the plasma source.

In certain embodiments, the method comprises: allowing gas from the inactive gas source to flow into the radical in-feed part via both a route travelling via the plasma source and via another route bypassing the plasma source during the plasma atomic layer deposition period.

In certain embodiments, the method comprises: allowing gas from the inactive gas source to flow into the radical in-feed part only via the route bypassing the plasma source during the thermal atomic layer deposition period, and guiding gas from the inactive gas source that flows via the plasma source into an evacuation line during that period.

In certain embodiments, the method comprises: guiding inert gas towards the reaction chamber via thermal atomic layer deposition in-feed line(s) during the plasma atomic layer deposition period, the thermal atomic layer deposition in-feed line(s) being separate from plasma source line(s) via which radicals are guided into the reaction chamber during the plasma atomic layer deposition period.

Accordingly, in certain embodiments the deposition reactor may comprise two routes from an inactive gas source to the in-feed part, while in some other embodiments only a singly route is implemented. In certain embodiments, the plasma source may be separated from the reaction chamber by a gate valve or a comparable closing member closing the route via the plasma source when needed so that then the route does not continue via the in-feed part into the reaction chamber, but bypasses the reaction chamber altogether.

In certain embodiments, the method comprises using a deformable in-feed part which is deformable between a contracted shape and an extended shape by at least one mechanical actuator.

In certain embodiments, a substrate holder carrying at least one substrate is mechanically coupled to the deformable in-feed part, and the method comprises: causing by deforming said deformable in-feed part said substrate holder carrying at least one substrate to lift into an upper position for loading or unloading.

According to a second example aspect of the invention there is provided a plasma atomic layer apparatus, comprising:
a gas line from an inactive gas source to a widening radical in-feed part opening towards a reaction chamber; and
a control system configured to allow gas from the inactive gas source to flow into in-feed part substantially during a whole deposition cycle, and
the plasma atomic layer deposition reactor being configured to deposit material in the reaction chamber on at least one substrate by sequential self-saturating surface reactions.

In certain embodiments, the apparatus or control system is configured to allow gas from the inactive gas source to flow into the radical in-feed part via a plasma source during a plasma precursor pulse period of a plasma atomic layer deposition period, the gas during that pulse period functioning as carrier gas for generated radicals.

In certain embodiments, the apparatus or control system is configured to allow gas from the inactive gas source to flow into the radical in-feed part via the plasma source during a purge period of a plasma atomic layer deposition period, the gas during that purge period functioning as purge and inert shield gas.

In certain embodiments, the apparatus or control system is configured to allow gas from the inactive gas source to flow into the radical in-feed part via the plasma source both during a plasma atomic layer deposition period and during a thermal atomic layer deposition period.

In certain embodiments, the apparatus or control system is configured to allow gas from an inactive gas source to flow into the radical in-feed part via a route that bypasses the plasma source.

In certain embodiments, the apparatus or control system is configured to allow gas from the inactive gas source to flow into the radical in-feed part via both a route travelling via the plasma source and via another route bypassing the plasma source during the plasma atomic layer deposition period.

In certain embodiments, the apparatus or control system is configured to:
allow gas from the inactive gas source to flow into the radical in-feed part only via the route bypassing the plasma source during the thermal atomic layer deposition period; and
guide gas from the inactive gas source that flows via the plasma source into an evacuation line during that period.

In certain embodiments, the apparatus or control system is configured to guide inert gas towards the reaction chamber via thermal atomic layer deposition in-feed line(s) during the plasma atomic layer deposition period, the thermal atomic layer deposition in-feed line(s) being separate from plasma source line(s) via which radicals are guided into the reaction chamber during the plasma atomic layer deposition period.

In certain embodiments, said in-feed part defining or forming the expansion space is variable in its dimensions or its shape or size. In certain embodiments, said lifting mechanism is configured to change the dimensions of said in-feed part.

In certain embodiments, said in-feed part is a part via which radicals enter the reaction chamber. In certain embodiments, said in-feed part has a contracted shape and an extended shape, the transition between these shapes being operated by a lifting mechanism (an elevator or similar). The elevator may be configured to push or pull said in-feed part from said extended shape to said contracted shape allowing said loading of said at least one substrate when said in-feed part is in its contracted shape. In certain embodiments, said in-feed part is configured to deform vertically.

In certain embodiments, said in-feed part comprises a set of nested sub-parts or ring-like members movable to fit within each other. The sub-parts may be hollow from inside. The number of nested sub-parts may be two or more to form a telescopic structure. The form of the nested sub-parts may be a truncated cone. In an embodiment, where said in-feed part practically consists of two or more sub-parts, at least the sub-part that is closest to the reaction space may be a truncated cone. In certain embodiments, said in-feed part consists of two nested sub-parts.

In certain embodiments, the in-feed part is deformable, and the apparatus comprises at least one mechanical actuator to deform the in-feed part between a contracted shape and an extended shape.

In certain embodiments, a substrate holder carrying at least one substrate is mechanically coupled to the deformable in-feed part, and wherein deforming said deformable in-feed part causes said substrate holder carrying at least one substrate to lift into an upper position for loading or unloading.

According to a third example aspect of the invention there is provided a plasma atomic layer apparatus, comprising:
means for operating a plasma atomic layer deposition reactor configured to deposit material in a reaction chamber on at least one substrate by sequential self-saturating surface reactions; and
means for allowing gas from an inactive gas source to flow into a widening radical in-feed part opening towards the reaction chamber substantially during a whole deposition cycle.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

In the following description, Atomic Layer Deposition (ALD) technology is used as an example. The purpose, however, is not to strictly limit to that technology but it has to be recognized that certain embodiments may be applicable also in methods and apparatus utilizing other comparable atomic-scale deposition technologies.

The basics of an ALD growth mechanism are known to a skilled person. Details of ALD methods have also been described in the introductory portion of this patent application. These details are not repeated here but a reference is made to the introductory portion with that respect.

Figure 1:
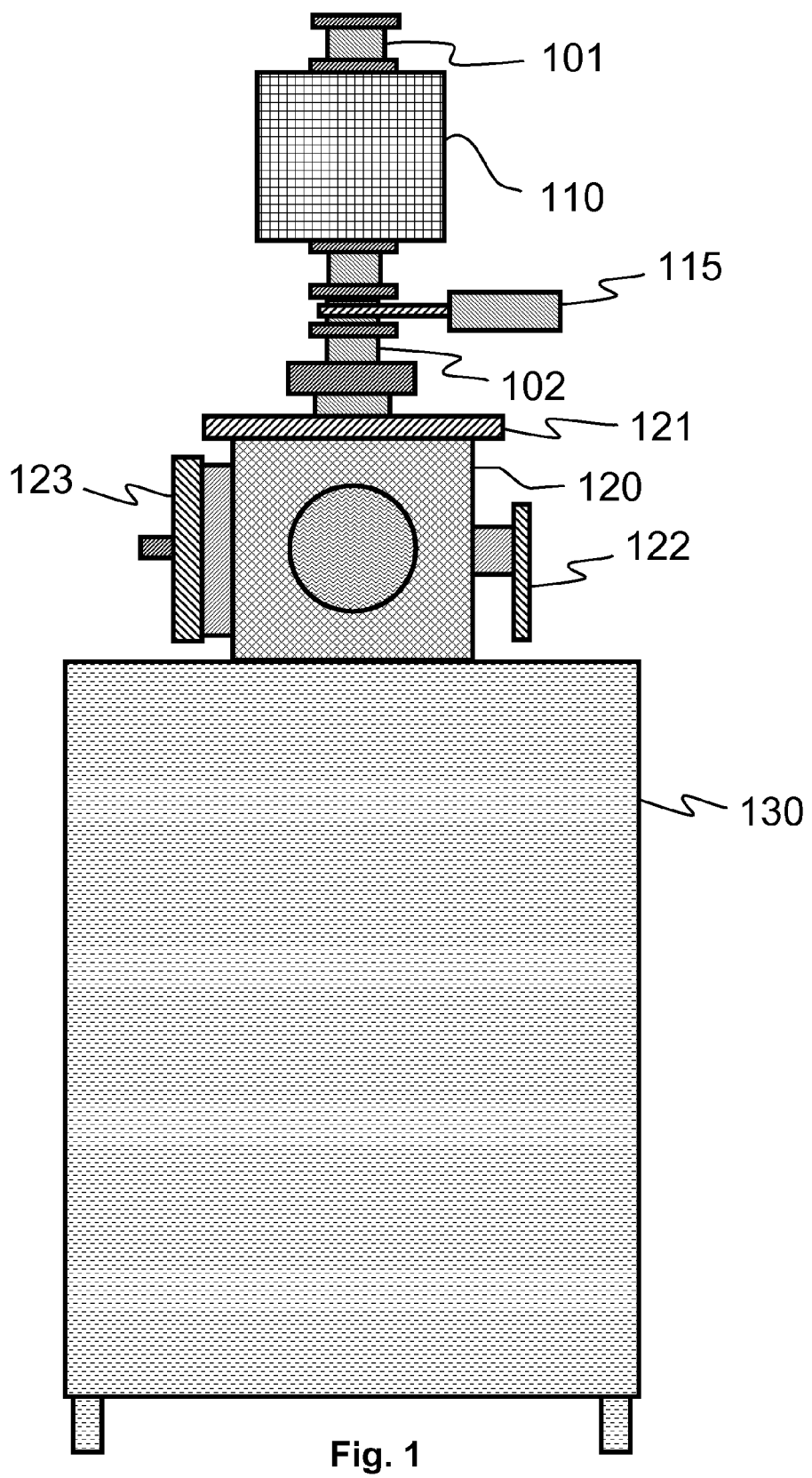
FIG. 1 shows a general framework of a deposition reactor in accordance with an example embodiment.

FIG. 1 shows a deposition reactor (a plasma ALD reactor or similar) in a side view. The deposition reactor comprises a reaction chamber (not shown in FIG. 1) below a substrate transfer chamber inside an ALD reactor module 130. Source gas flows via a carrier and purge gas line 101 into a plasma source 110 on the top side of the reaction chamber. Radicals generated by the plasma source 110 from the source gas flow via a reaction chamber in-feed line or plasma source line 102 towards the reaction chamber. In between the plasma source 110 and the reaction chamber there is the substrate transfer chamber 120. At least one substrate is loaded into the reaction chamber via the transfer chamber 120. The substrate transfer chamber 120 comprises an interface for a load lock or similar for loading said at least one substrate. In an example embodiment, the interface may be a load lock flange 122, or similar, to which a load lock having a gate valve can be attached. In an example embodiment, loading of the at least one substrate into the transfer chamber may be an automated procedure. Alternatively, the at least one substrate may be loaded manually. A larger hatch 123 integrated to the transfer chamber is particularly suitable for manual loading and unloading in the room pressure.

The plasma source line 102 from the plasma source may be closed prior to the transfer chamber 120 by a closing member or valve 115, such as a gate valve or similar (hereinafter referred to the gate valve 115), attached to the plasma source line 102. When the valve 115 is open, radicals generated by the plasma source 110 from the source gas flow via the plasma source line 102 towards the reaction chamber. The radicals flow through the transfer chamber upper flange 121 into an expansion space (not shown in FIG. 1) that widens towards the reaction chamber. This, and other additional details, is shown in more detail in FIG. 2. In an embodiment as shown in more detail in FIG. 6 and related description, the closing member or valve 115 may be omitted from the construction and there is a protective inert gas (such as argon) flow from the source gas line 101 through the plasma generator 110 towards the reaction space (331, FIG. 3) during the deposition process.

The expansion space is defined or formed by an in-feed part or an assembly comprising a set of nested sub-parts or ring-like members which are movable to fit within each other. In the embodiment shown in FIG. 2, the number of sub-parts is two. The sub-parts 241 and 242 form a telescopic structure. In the example embodiment shown in FIG. 2 the upper sub-part 241 is attached to the transfer chamber upper flange 121. The flange 121 may also be denoted as a vacuum chamber flange, since a vacuum or almost a vacuum can typically be generated into the portion of the transfer chamber that surrounds the in-feed part. In the example embodiment shown in FIG. 2 the lower sub-part 242 is attached to an expansion space flange 224 which, during deposition, is substantially leak-tightly fitted against a reaction chamber flange 234 preventing gas leaks between the reaction space (331, FIG. 3) and the gas space surrounding the reaction chamber (335, FIG. 3).

Figure 2:
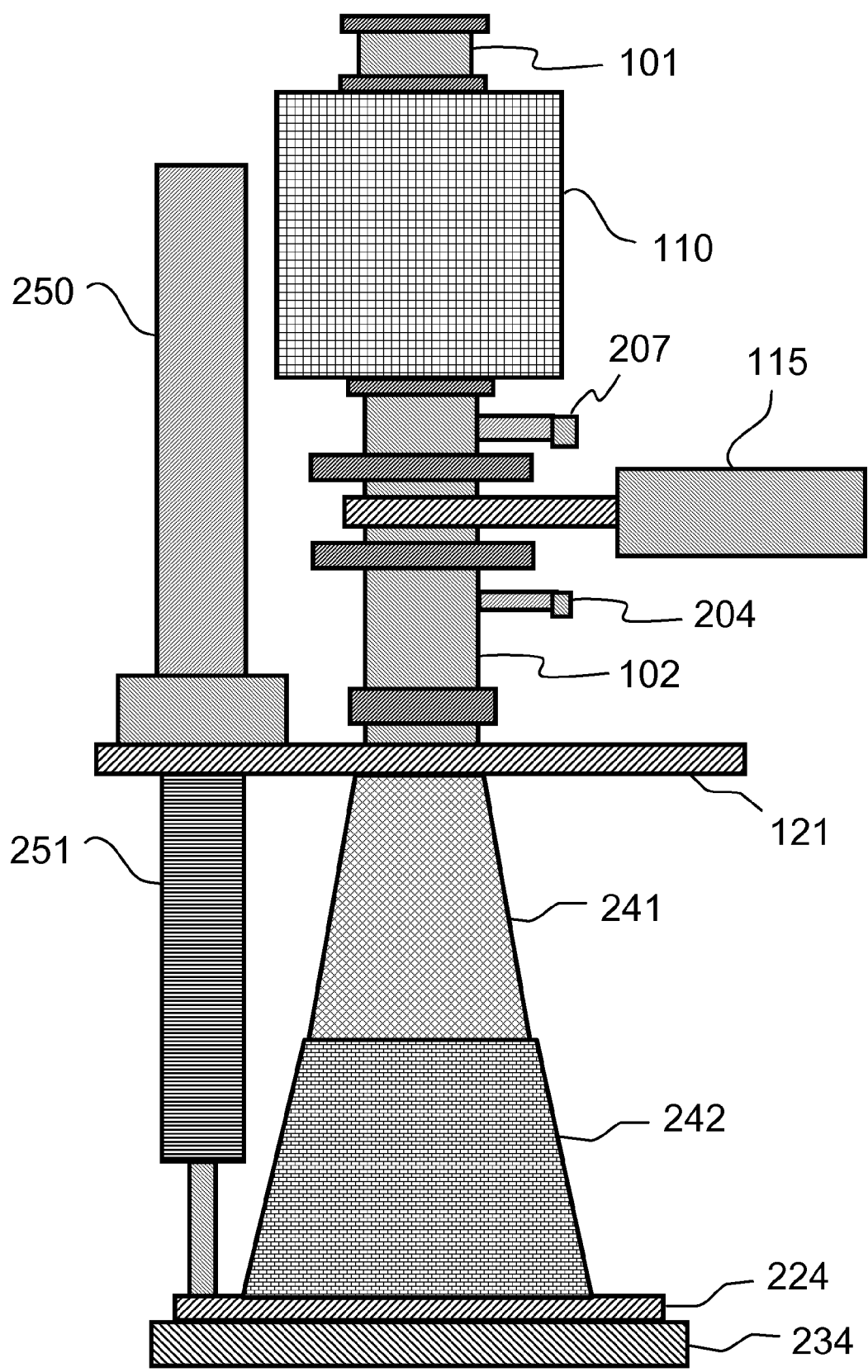
FIG. 2 shows certain details of the deposition reactor in accordance with an example embodiment.

In the embodiment shown in FIG. 2, a retractable shaft of an elevator 250 is attached to the expansion space flange 224, or directly to the in-feed part. The body of the elevator 250 may also be attached to the transfer chamber upper flange 121 or to another suitable counterpart in the deposition reactor. The elevator 250 may be for example an elevator which operates by means of a rigid retractable shaft at least partially covered with bellows 251 or similar. In an embodiment, this arrangement forms a leak-tight vertically flexible cover between a pneumatic or a linear actuator and the expansion space flange 224 or the in-feed part. In an embodiment, a linear feedthrough for moving the in-feed part and expansion space flange together with the substrate holder in vacuum and controlled from atmosphere side is used.

The deposition reactor shown in FIG. 2 has an optional evacuation line 207 in fluid communication with the plasma source line 102. The evacuation line 207 is joined to the plasma source line 102 on the portion of the plasma source line 102 between the plasma source 110 and the gate valve 115.

Further, the deposition reactor shown in FIG. 2 has an optional shield gas line 204 in fluid communication with the plasma source line 102. Inactive shield gas flowing in the shield gas line prevents particle or gas flow in the upstream direction. The shield gas line 204 is joined to the plasma source line 102 on the portion of the plasma source line 102 after the gate valve 115, in an embodiment immediately next to the gate valve 115 in the downstream direction.

In an alternative embodiment, the expansion space flange 224 is not separate from the in-feed part but forms part of the in-feed part thus forming a bottom part of the in-feed part. The bottom part in that embodiment functions as a rim seal against the reaction chamber. On the other hand, it functions as a fixing point for the elevator 250 (elevator shaft).

Figure 3:
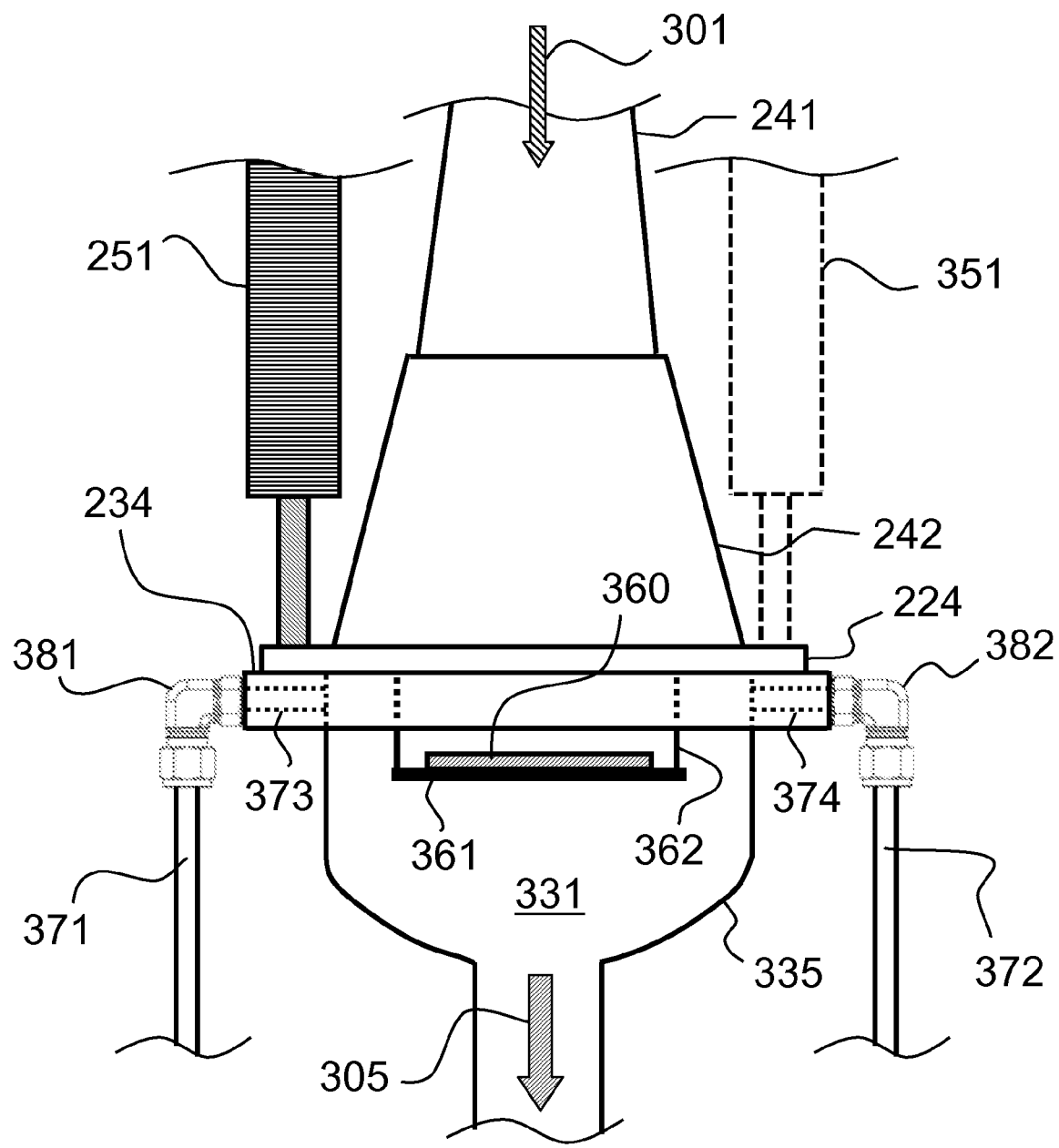
FIG. 3 shows a reaction chamber and certain related parts of the deposition reactor in accordance with an example embodiment.

In a reaction space 331 of reaction chamber 335, as shown by FIG. 3, at least one horizontally placed substrate 360 is supported by or lies on a substrate holder 361. In an embodiment, the substrate holder comprises two separate sections with an open gap wide enough for allowing free movement of a substrate fork between the sections. The substrate holder 361 is attached to the expansion space flange 224 by holder supports 362. In an example embodiment, the substrate holder 361 is configured to move together with the expansion space flange 224. In an embodiment, the bottom end of the elevator bellows 251 is leak-tightly coupled up with the shaft. Pulling the shaft within the elevator bellows 251 with the actuator contracts the elevator bellows 251, and the at least one substrate 360 or the substrate holder 361 can be pulled up for loading or unloading while keeping the substrate handling area and its surroundings in vacuum. The in-feed part comprising the sub-parts 241 and 242 contracts vertically when the sub-part 242 slides onto the smaller sub-part 241 leaving a space for loading and unloading via the transfer chamber 120 (FIG. 1). There can be more than one elevator, such as two elevators. The elevator bellows 351 of a second elevator has been shown in FIG. 3 with dotted lines.

In an embodiment, the substrate holder 361 is detachably attachable to the expansion space flange 224. In that way the substrate holder 361 together with the at least one substrate 360 can be loaded or unloaded when pulled up. Similarly, a batch of substrates vertically placed in a substrate holder can be loaded into and unloaded from the deposition reactor.

Deposition of material on the at least one substrate 360 occurs by alternating sequential self-saturating surface reactions in the reaction space 331 of the reaction chamber 335. Alternately, radicals from the plasma source 110 (FIGS. 1 and 2) and other precursor vapor flow to the reaction space 331 of the reaction chamber 335. Radicals from the plasma source 110 flow as a top to bottom flow 301 via the expansion space to the reaction space 331. The other precursor vapor flow either via in-feed line 371 via an example tube fitting 381 and channel 373 within the reaction chamber flange 234 or via in-feed line 372 an example tube fitting 382 and channel 374 within the reaction chamber flange 234. In a typical reactor construction the number of in-feed lines is for example 4 or 6. Alternatively, the other precursor may also flow into the reaction chamber 335 via the plasma source line 102 with the plasma generation shut off. Exhaust gases are removed via an exhaust guide on the bottom to an exhaust line as indicated with the flow direction arrow 305.

In an embodiment, the gas space between the plasma generator (plasma source 110) and the substrate holder 361 substantially consists of an open gas space so that the majority of radicals generated by the plasma generator is capable of arriving essentially intact to the substrate 360 without hitting any surfaces before the substrate.

Figure 4:
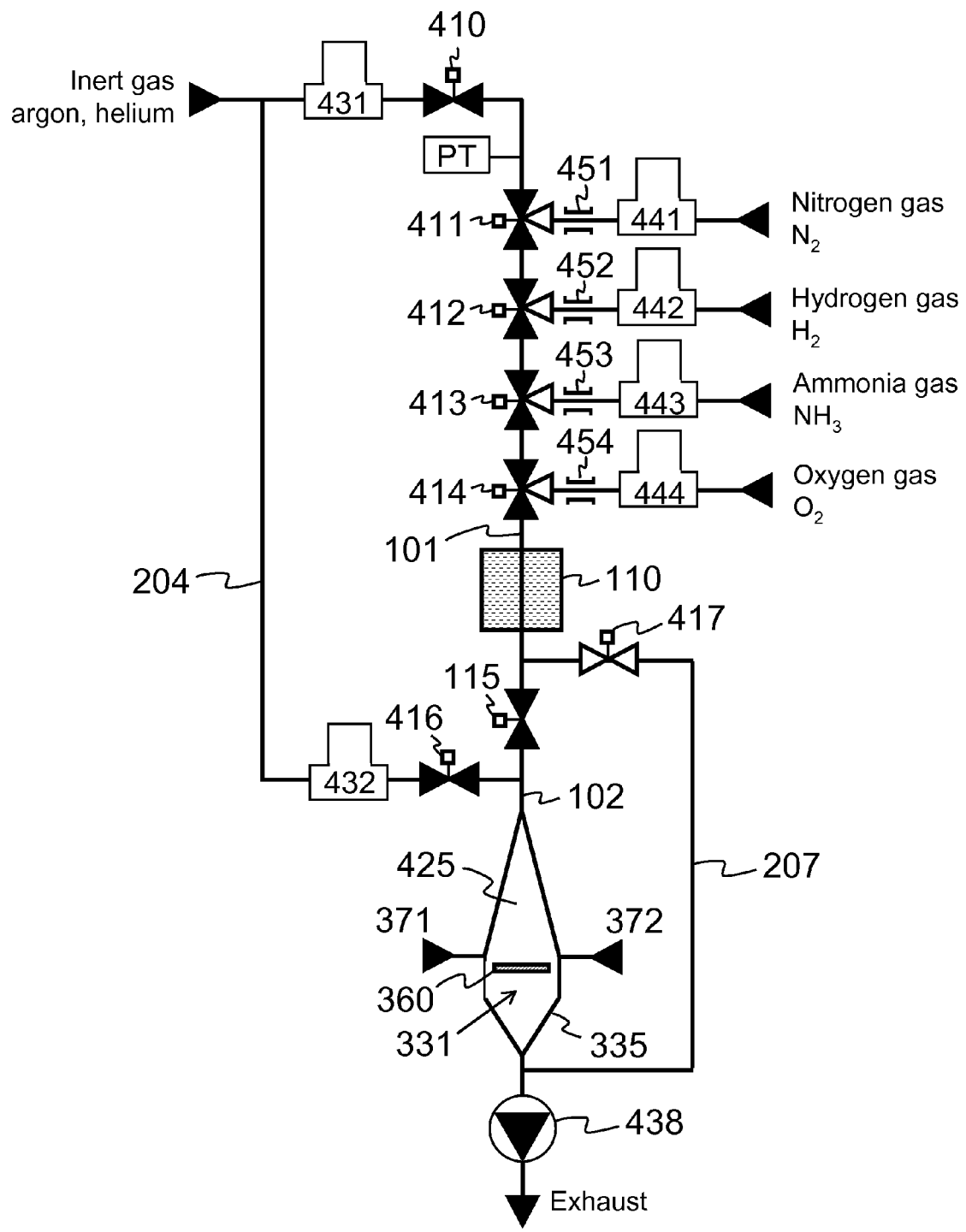
FIG. 4 shows process instrumentation of the deposition reactor in accordance with an example embodiment.

FIG. 4 shows process instrumentation of the deposition reactor in accordance with an example embodiment. An inert gas flow from an inert (or inactive) gas source is divided into a carrier and purge gas flow that flows via the carrier and purge gas line 101 and a shield gas flow that flows via the shield gas line 204. In an embodiment, argon or helium, or similar, is used as the inert gas. The carrier and purge gas line 101 can be opened and closed by a carrier and purge valve 410. During operation, the default position of the valve 410 is 'open'. The shield gas line 204 can be opened and closed by a shield gas valve 416. During operation, the default position of the valve 416 is 'open'. The flow rate in the carrier and purge gas line 101 is controlled by a mass flow controller (MFC) 431, and the flow rate in the shield gas line 204 is controlled by a mass flow controller 432. The shield gas line 204 joins to the plasma source line 102 downstream the gate valve 115. During operation, the default position of the gate valve is 'open'. The combined flow flows via the plasma source line 102 and enters the reaction chamber 335 via the expansion space 425. A vacuum pump 438 is used for purging exhaust gases from the reaction space 331 into the exhaust line. The pressure transducer PT is used for verifying that the plasma source line pressure is in a suitable range for operating the remote plasma generator.

Downstream the carrier and purge valve 410 before entering the plasma source 110, the carrier and purge gas flows through plasma source precursor pulsing valves 411-414. In an embodiment, the valves are three-way valves. The carrier and purge gas flows into a first input of a pulsing valve and outputs via an output. In this context a precursor that can flow via a pulsing valve 411-414 into the carrier and purge gas line 101 and can subsequently be used to generate radicals in the plasma source 110 is denoted as plasma source precursor. The desired plasma source precursor, depending on the applied deposition cycle, is guided via an MFM (Mass Flow Meter) and through a capillary or a needle valve into a second input of a corresponding pulsing valve. During operation, the default position of valves 411-414 is that the first input and output are 'open', the second input is 'closed' and will be opened only during plasma precursor pulse periods of a selected plasma source precursor.

In the embodiment shown in FIG. 4, nitrogen gas, hydrogen gas, ammonia gas and oxygen gas serve as examples of plasma source precursors. The mass flow meter MFM 441 measures the flow rate of nitrogen gas from a nitrogen gas source through a capillary or needle valve 451 to the nitrogen pulsing valve 411. Similarly, the MFM 442 measures the flow rate of hydrogen gas from a hydrogen gas source through a capillary or needle valve 452 to the hydrogen pulsing valve 412, the MFM 443 measures the flow rate of ammonia gas from an ammonia gas source through a capillary or needle valve 453 to the ammonia pulsing valve 413, and the MFM 444 measures the flow rate of oxygen gas from an oxygen gas source through a capillary or needle valve 454 to the oxygen pulsing valve 414. MFMs 441-444 are used for verifying that the mass flow rate of the plasma source precursor settles to a desired value controlled with the pressure of the plasma source precursor to the upstream of the capillary or needle valve 451-454 and with the orifice size of the capillary or with the adjustment of needle valve 451-454. When the second input of a pulsing valve is open, the corresponding plasma source precursor is mixed with the carrier gas flow and flows further towards the plasma source 110 for radical generation.

The evacuation line 207 joined to the plasma source line 101 downstream of the plasma source 110 and upstream of the gate valve 115 is not used during normal operation. Accordingly, the default position of an evacuation valve 417 (by which the evacuation line 207 can be opened and closed) is 'closed'.

In FIG. 4 there are also shown the other in-feed lines 371 and 372 visible in FIG. 3 via which other precursor vapor may flow into the reaction chamber 335 during, for example, a thermal ALD period.

Figure 5:
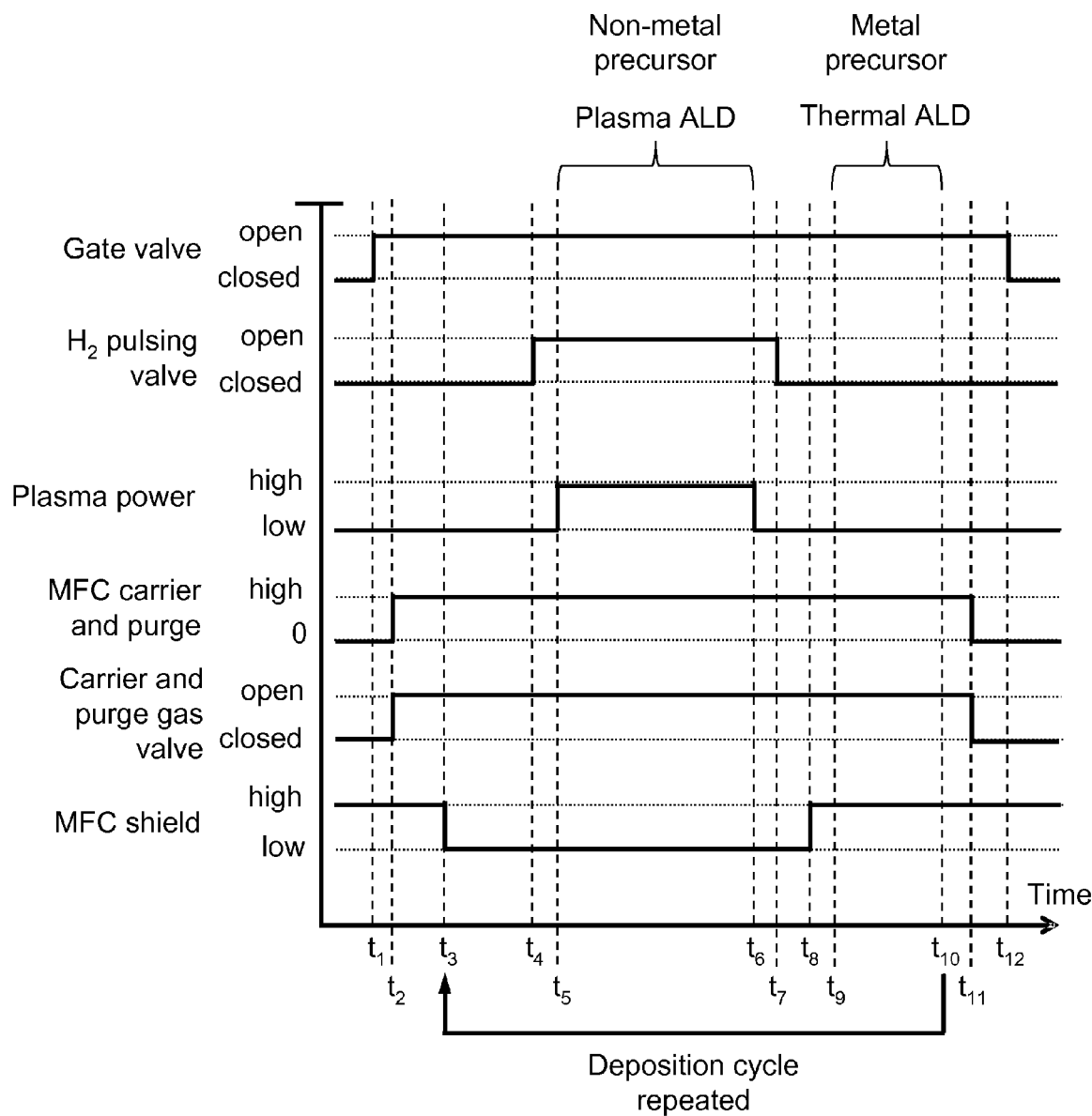
FIG. 5 shows an example of a timing diagram in the example embodiment of FIG. 4.

FIG. 5 shows the operation of the deposition reactor of FIG. 4 by means of a timing diagram in accordance with an example embodiment. The deposition process is basically formed by repeated deposition cycles. At time instant $t_1$, the gate valve 115 of the plasma source line 102 is opened. The gate valve 115 remains opened during the whole deposition process. At time instant $t_2$, the isolation valve (carrier and purge valve 410) of the carrier and purge gas line 101 is opened. The MFC 431 of the carrier and purge gas line 101 is set to a processing value, e.g., 50 sccm. At time instant $t_3$, the MFC 432 of the shield gas line 204 is set from a high value to a low value, e.g., 20 sccm. The time between $t_3$ and $t_4$ can be used for purging the reaction chamber 335. At time instant $t_4$, the pulsing valve of a (non-metal) plasma source precursor is opened. In the example shown in FIG. 5, hydrogen gas is used as the plasma source precursor, so at time instant $t_4$ it is the pulsing valve 412 that is opened. At time instant $t_5$, the power of the plasma generator (plasma source 110) is increased to the radical generation level, e.g., 2000 W. In an embodiment, the power herein mentioned is radio frequency (RF) power. Radicals are generated during the time between $t_5$ and $t_6$. In other words, between time instants $t_5$ and $t_6$ a plasma ALD phase is carried out. At time instant $t_6$, the power of the plasma generator (plasma source 110) is lowered to a level where radicals are not generated, e.g., to a power that is less than 100 W. At time instant $t_7$, the pulsing valve (here: valve 412) of the plasma source precursor is closed. At time instant $t_8$, the MFC 432 of the shield gas line 204 is set from a low value to a high value. The time between $t_7$ and $t_9$ can be used for purging the reactor chamber 335. At time instant $t_9$, second precursor vapor is guided into the reaction chamber 335. In the present embodiment, the second precursor is a metal precursor. Between $t_9$ and $t_{10}$ the second precursor pulse phase is carried out. The time between $t_9$ and $t_{10}$ may consist of the second precursor pulse and the third purge period for removing surplus second precursor molecules and reaction byproducts from the reaction space 331 while the mass flow rate of the shield gas through the shield gas line 204 is at the high value for preventing the backstreaming of reactive molecules towards the gate valve 115 and the remote plasma generator 110. This can be carried out as the as-such known conventional thermal ALD method. The deposition cycle formed by the purge period between $t_3$ and $t_4$, the plasma ALD phase between $t_5$ and $t_6$, the second purge period between $t_7$ and $t_9$, and the thermal ALD phase between $t_9$ and $t_{10}$ is repeated until a desired thickness of material has grown onto the at least one substrate in the reaction chamber 335. In the end, at time instant $t_{11}$, the carrier and purge valve 410 is closed, and the MFC 431 of the carrier and purge gas line 101 is set to a zero value. Finally, the gate valve 115 is closed at time instant $t_{12}$.

An alternative embodiment concerns, for example, situations in which for a certain reason the plasma source line 102 is desired to be closed by the gate valve 115 during a deposition process. This can occur, for example, during the thermal ALD phase, or if the reactor is desired to carry out a deposition process with thermal ALD phases only. In these embodiments, the route via the pulsing valves 411-414 and the plasma source 110 to the reaction space 331 is closed. Since a constant pressure should preferably be maintained in the plasma source 110, the evacuation line valve 417 is opened and a gas flow through the plasma source 110 is guided via the evacuation line 207 directly to the exhaust line to maintain a constant pressure. Shield gas flowing from the shield gas line 204 forms a shielding buffer preventing particle and gas flow from rising from the direction of the reaction chamber 335 into the direction of the gate valve 115.

Figure 6:
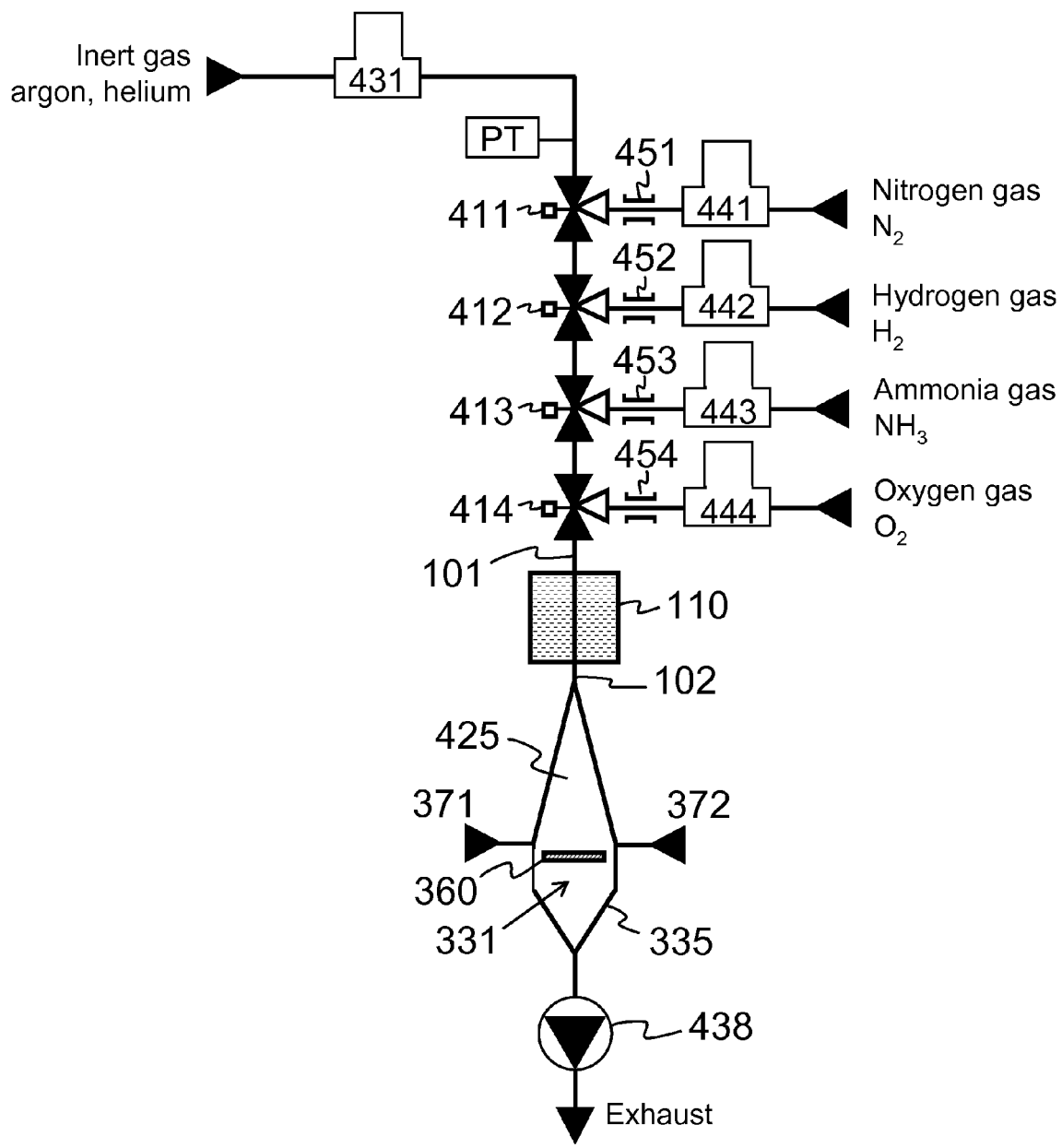
FIG. 6 shows process instrumentation of a deposition reactor in accordance with another example embodiment.

FIG. 6 shows process instrumentation of the deposition reactor in accordance with another example embodiment. The embodiment shown in FIG. 6 otherwise corresponds to the embodiment shown in FIG. 4 except that it does not contain the gate valve 115, the related evacuation line 207, the shield gas line 204 and the carrier and purge valve 410.

In certain embodiments, oxygen radicals generated from oxygen gas are used for growing metal oxides, such as oxides of group 3 metals (e.g. yttrium oxide), oxides of group 4 metals (e.g. hafnium dioxide), oxides of group 5 metals (e.g. tantalum pentoxide) and oxides of group 13 metals (e.g. aluminum oxide). Ammonia radicals generated from ammonia gas and nitrogen radicals generated from nitrogen gas are used for growing metal nitrides, such as nitrides of group 4 metals (e.g. titanium nitride), nitrides of group 5 metals (e.g. tantalum nitride and superconducting niobium nitride) and nitrides of group 14 elements (e.g. silicon nitride). Hydrogen radicals generated from hydrogen gas are used as a reducing agent for growing elemental thin films, such as group 4 metals (e.g. titanium), group 5 metals (e.g. tantalum), group 6 metals (e.g. tungsten) and group 11 metals (e.g. silver). Volatile hydrocarbons are utilized for generating hydrocarbon radicals for growing metal carbides, such as carbides of group 4 metals (e.g. titanium carbide).

Figure 7:
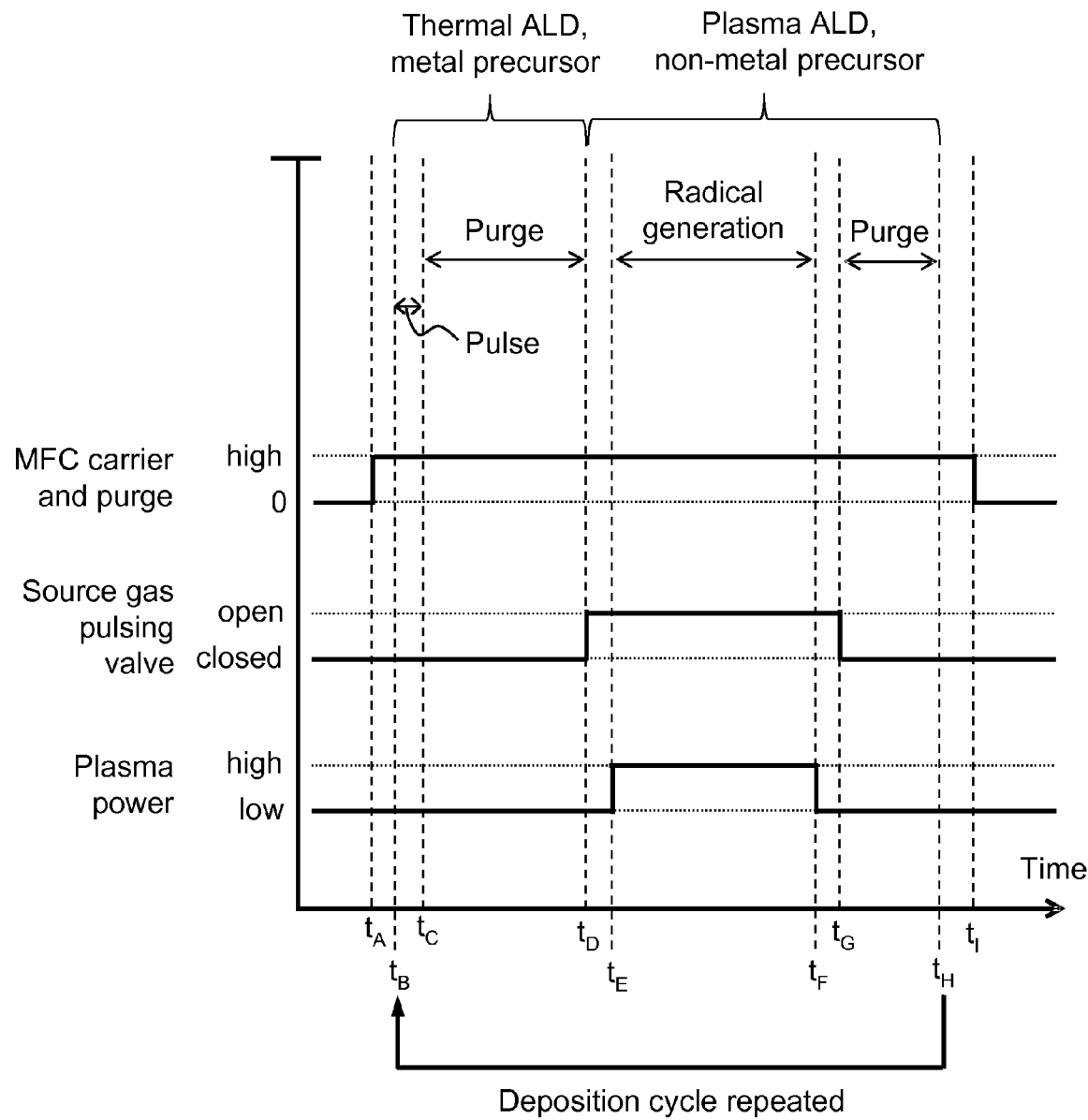
FIG. 7 shows an example of a timing diagram in the example embodiment of FIG. 6.

FIG. 7 shows the operation of the deposition reactor of FIG. 6 by means of a timing diagram in accordance with an example embodiment. At time instant $t_A$ the MFC 431 of the carrier and purge gas line 101 is set to a processing value, preferably in the range of 10-200 sccm, more preferably in the range of 20-100 sccm, e.g., 50 sccm. The time between $t_B$ and $t_C$ is used for pulsing metal precursor vapor, e.g. trimethylaluminum (TMA), in thermal ALD mode to the reaction space 331 heated to a temperature selected from a range of approximately 50-500° C., e.g. 200° C. in case of TMA used as a metal precursor. The time between $t_C$ and $t_D$ is used for purging the reaction space 331 with inert gas that consists of argon or helium gas from the plasma source line 102 and nitrogen gas from the in-feed lines 371, 372. At time instant $t_D$, the pulsing valve of a (non-metal) plasma source precursor is opened. Oxygen gas is selected from the available plasma source gases in FIG. 6, so at time instant $t_D$ it is the pulsing valve 414 that is opened. At time instant $t_E$, the power of the plasma generator (plasma source 110) is increased to the radical generation level, to the RF power selected from a range of 100-3000 W, e.g., 2000 W in case of oxygen radical generation. Radicals are generated during the time between $t_E$ and $t_F$. In other words, between time instants $t_E$ and $t_F$ a plasma ALD phase is carried out. At time instant $t_F$, the power of the plasma generator (plasma source 110) is lowered to a level where radicals are not generated, preferably to a power that is less than 100 W, e.g. 0 W. At time instant $t_G$, the pulsing valve (here: oxygen gas valve 414) of the plasma source precursor is closed. The time between $t_G$ and $t_H$ is used for purging the system with inert gas. The deposition cycle from the time instant $t_B$ to the time instant $t_H$ consisting of the metal precursor pulse, purge, radical precursor pulse and purge is repeated until a thin film of desired thickness is grown on the substrate 360.

It is to be noted that several variants of the embodiments presented herein may be implemented. In a construction shown in FIG. 4 the deposition cycle may be implemented in the order shown in FIG. 5, or for example, in the order shown in FIG. 7.

In certain embodiments, gas is guided to flow from the inactive gas source into the radical in-feed part (or expansion space 425) via the plasma generator (plasma source 110) during the plasma precursor pulse period of the plasma ALD period, the gas during that pulse period functioning as carrier gas for generated radicals, and in certain embodiments, gas is guided to flow from the inactive gas source into the expansion space 425 via the plasma generator during the purge period of the plasma ALD period, the gas during that purge period functioning as inert or purge gas. In certain embodiments, gas is guided in this way during both of these periods. During both of these periods, gas from the inactive gas source is additionally guided in certain embodiments into the expansion space 425 via the shield gas line 204. During, for example, a thermal ALD period, gas from the inactive gas source is guided in certain embodiments into the expansion space 425 via both routes, or via the shield gas line 204 only (in the event, the route from the plasma generator to the expansion space 425 is, for example, closed). Also, whenever the route from the plasma generator to the expansion space 425 is otherwise closed, gas from the inactive gas source is guided in certain embodiments during these periods into the expansion space 425 via the shield gas line 204 causing a continuous inert gas flow into the expansion space 425 and preventing the backstreaming effect. If the route from the plasma generator to the expansion space 425 is closed, gas from the inactive gas source that flows via the plasma generator is guided in certain embodiments into an evacuation line during that period so as to maintain a constant pressure in the plasma generator.

The following experimental example further demonstrates the operation of selected example embodiments.

Example 1

A 100-mm silicon wafer was loaded to the reaction chamber 335 with the dual elevator shown in FIG. 3. The instrumentation of the deposition reactor according to FIG. 6 and the timing diagram of FIG. 7 were used for growing aluminum oxide $Al_2O_3$ from trimethyl aluminum TMA and water $H_2O$ on the silicon wafer at 200° C. The flow rate of argon gas was 30 sccm through the carrier and purge gas line 101. The TMA pulse length was 0.1 s followed by the 6 s purge. Oxygen gas pulsing valve 414 was opened and 50 sccm of oxygen gas was flowing through the pulsing valve 414 to the remote plasma generator 110. The RF power was increased from 0 W to 2500 W to switch on the plasma and kept at the 2500 W level for 6 s. After that the RF power was lowered from 2500 W to 0 W to switch off the plasma. Next the oxygen gas valve was closed and the system was purged with inert gas for 10 s. The deposition cycle was repeated until a 36-nm $Al_2O_3$ thin film was grown. As a result, the 1-sigma non-uniformity of the thin film thickness measured with an ellipsometer from 49 points was only 1.3%.

Figure 8:
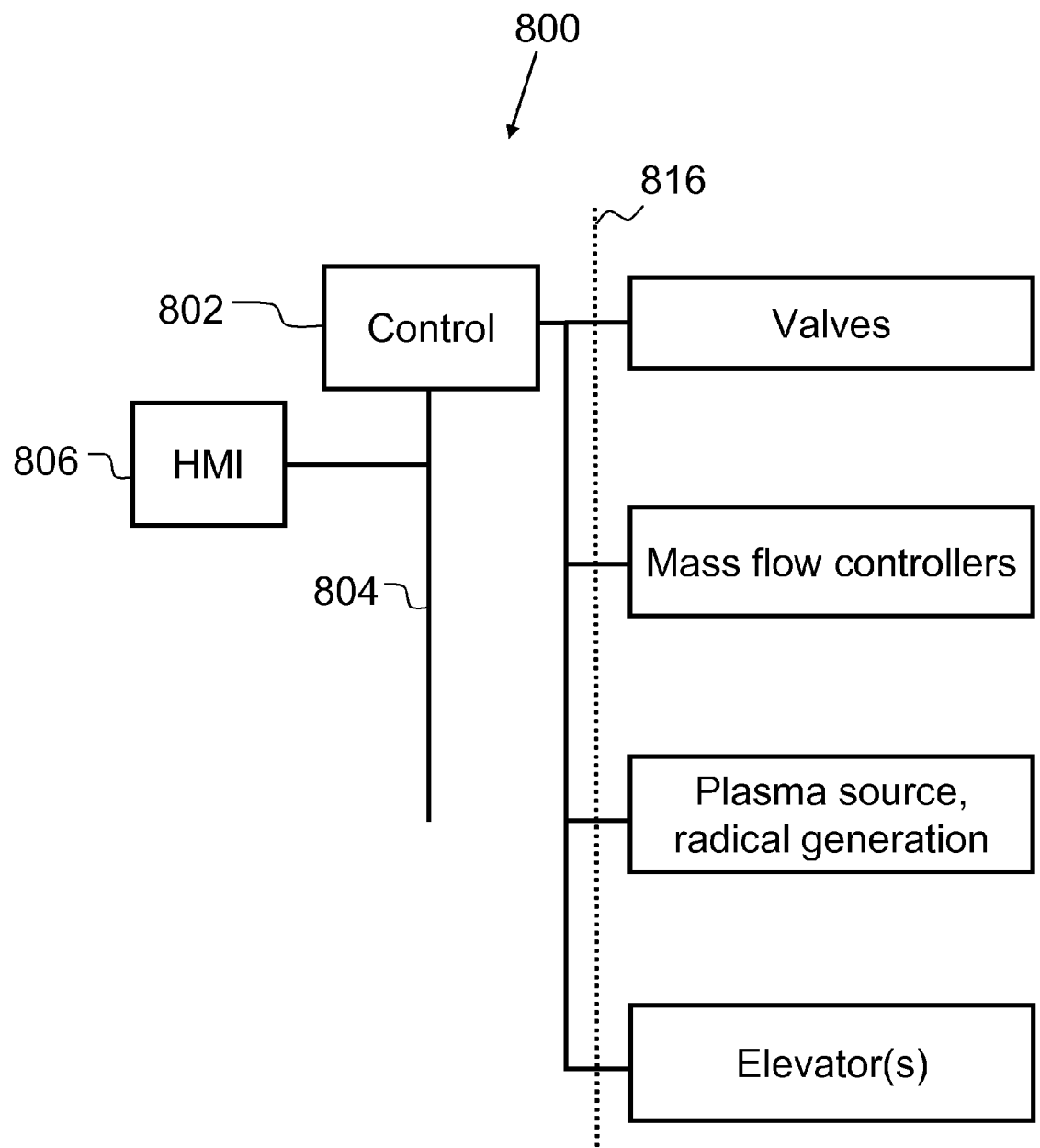
FIG. 8 shows a rough block diagram of a deposition reactor control system in accordance with an example embodiment.

In an example embodiment, the deposition reactor described herein is a computer-controlled system. A computer program stored into a memory of the system comprises instructions, which upon execution by at least one processor of the system cause the deposition reactor to operate as instructed. The instructions may be in the form of computer-readable program code. FIG. 8 shows a rough block diagram of a deposition reactor control system 800. In a basic system setup process parameters are programmed with the aid of software and instructions are executed with a human machine interface (HMI) terminal 806 and downloaded via Ethernet bus 804 to a control box 802. In an embodiment, the control box 802 comprises a general purpose programmable logic control (PLC) unit. The control box 802 comprises at least one microprocessor for executing control box software comprising program code stored in a memory, dynamic and static memories, I/O modules, A/D and D/A converters and power relays. The control box 802 sends electrical power to pneumatic controllers of the valves of the deposition reactor, and has two-way communication with mass flow controllers, and controls the operation of the plasma source and radical generation and the elevator, as well as otherwise controls the operation of the deposition reactor. The control box 802 may measure and relay probe readings from the deposition reactor to the HMI terminal 806. A dotted line 816 indicates an interface line between the deposition reactor parts and the control box 802.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A method comprising:
    operating a plasma atomic layer deposition reactor configured to deposit material in a reaction chamber on at least one substrate by sequential self-saturating surface reactions;
    allowing gas from an inactive gas source to flow into a widening radical in-feed part opening towards the reaction chamber substantially during a whole deposition cycle; and
    guiding inert gas towards the reaction chamber via thermal atomic layer deposition in-feed line(s) during the plasma atomic layer deposition period, the thermal atomic layer deposition in-feed line(s) being separate from plasma source line(s) via which radicals are guided into the reaction chamber during the plasma atomic layer deposition period.

2. The method of claim 1, comprising:
    allowing gas from the inactive gas source to flow into the radical in-feed part via a plasma source during a plasma precursor pulse period of a plasma atomic layer deposition period, the gas during that pulse period functioning as carrier gas for generated radicals.

3. The method of claim 1, comprising:
allowing gas from the inactive gas source to flow into the radical in-feed part via the plasma source during a purge period of a plasma atomic layer deposition period, the gas during that purge period functioning as purge and inert shield gas.

4. The method of claim 1, comprising:
allowing gas from the inactive gas source to flow into the radical in-feed part via the plasma source both during a plasma atomic layer deposition period and during a thermal atomic layer deposition period.

5. The method of claim 1, comprising:
allowing gas from an inactive gas source to flow into the radical in-feed part via a route that bypasses the plasma source.

6. The method of claim 1, comprising:
allowing gas from the inactive gas source to flow into the radical in-feed part via both a route travelling via the plasma source and via another route bypassing the plasma source during the plasma atomic layer deposition period.

7. The method of claim 1, comprising:
allowing gas from the inactive gas source to flow into the radical in-feed part only via the route bypassing the plasma source during the thermal atomic layer deposition period, and
guiding gas from the inactive gas source that flows via the plasma source into an evacuation line during that period.

8. The method of claim 1, comprising:
using a deformable in-feed part which is deformable between a contracted shape and an extended shape by at least one mechanical actuator.

9. The method of claim 8, wherein a substrate holder carrying at least one substrate is mechanically coupled to the deformable in-feed part, the method comprising:
causing by deforming said deformable in-feed part said substrate holder carrying at least one substrate to lift into an upper position for loading or unloading.

10. A plasma atomic layer apparatus, comprising:
a gas line from an inactive gas source to a widening radical in-feed part opening towards a reaction chamber;
a control system configured to allow gas from the inactive gas source to flow into in-feed part substantially during a whole deposition cycle, and
the plasma atomic layer deposition reactor being configured to deposit material in the reaction chamber on at least one substrate by sequential self-saturating surface reactions, and
the control system being configured to guide inert gas towards the reaction chamber via thermal atomic layer deposition in-feed line(s) during the plasma atomic layer deposition period, the thermal atomic layer deposition in-feed line(s) being separate from plasma source line(s) via which radicals are guided into the reaction chamber during the plasma atomic layer deposition period.

11. The apparatus of claim 10, wherein the control system is configured to allow gas from the inactive gas source to flow into the radical in-feed part via a plasma source during a plasma precursor pulse period of a plasma atomic layer deposition period, the gas during that pulse period functioning as carrier gas for generated radicals.

12. The apparatus of claim 10, wherein the control system is configured to allow gas from the inactive gas source to flow into the radical in-feed part via the plasma source during a purge period of a plasma atomic layer deposition period, the gas during that purge period functioning as purge and inert shield gas.

13. The apparatus of claim 10, wherein the control system is configured to allow gas from the inactive gas source to flow into the radical in-feed part via the plasma source both during a plasma atomic layer deposition period and during a thermal atomic layer deposition period.

14. The apparatus of claim 10, wherein the control system is configured to allow gas from an inactive gas source to flow into the radical in-feed part via a route that bypasses the plasma source.

15. The apparatus of claim 10, wherein the control system is configured to allow gas from the inactive gas source to flow into the radical in-feed part via both a route travelling via the plasma source and via another route bypassing the plasma source during the plasma atomic layer deposition period.

16. The apparatus of claim 10, wherein the control system is configured to:
allow gas from the inactive gas source to flow into the radical in-feed part only via the route bypassing the plasma source during the thermal atomic layer deposition period; and
guide gas from the inactive gas source that flows via the plasma source into an evacuation line during that period.

17. The apparatus of claim 10, wherein said in-feed part is deformable, and the apparatus comprises at least one mechanical actuator to deform the in-feed part between a contracted shape and an extended shape.

18. The apparatus of claim 17, wherein a substrate holder carrying at least one substrate is mechanically coupled to the deformable in-feed part, and wherein deforming said deformable in-feed part causes said substrate holder carrying at least one substrate to lift into an upper position for loading or unloading.

* * * * *